(12) United States Patent
Binzaid et al.

(10) Patent No.: US 10,475,705 B2
(45) Date of Patent: Nov. 12, 2019

(54) CMOS PROCESS-DEPENDENT NEAR-THRESHOLD VOLTAGE REGULATION

(71) Applicants: Shuza Binzaid, San Antonio, TX (US); Avadhoot Herlekar, San Antonio, TX (US)

(72) Inventors: Shuza Binzaid, San Antonio, TX (US); Avadhoot Herlekar, San Antonio, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/817,716

(22) Filed: Nov. 20, 2017

(65) Prior Publication Data

US 2018/0144985 A1 May 24, 2018

Related U.S. Application Data

(60) Provisional application No. 62/424,802, filed on Nov. 21, 2016.

(51) Int. Cl.
| | | |
|---|---|---|
| *H01L 21/8238* | (2006.01) | |
| *H01L 27/092* | (2006.01) | |
| *G06F 1/3234* | (2019.01) | |
| *G06F 1/28* | (2006.01) | |
| *G05F 1/575* | (2006.01) | |
| *G06F 1/26* | (2006.01) | |
| *G06F 1/32* | (2019.01) | |

(Continued)

(52) U.S. Cl.
CPC ......... *H01L 21/8238* (2013.01); *G05F 1/575* (2013.01); *G06F 1/26* (2013.01); *G06F 1/28* (2013.01); *G06F 1/32* (2013.01); *G06F 1/3234* (2013.01); *H01L 27/0922* (2013.01); *G11C 5/147* (2013.01); *H01L 22/34* (2013.01)

(58) Field of Classification Search
CPC .................................................... G05F 1/571
See application file for complete search history.

(56) References Cited

U.S. PATENT DOCUMENTS

| | | | | |
|---|---|---|---|---|
| 2005/0007178 A1* | 1/2005 | Fahim | .................. | H03K 17/063 327/390 |
| 2008/0258700 A1* | 10/2008 | Block | .................. | H03L 7/0805 323/318 |

(Continued)

OTHER PUBLICATIONS

Binzaid, S., and A. Herlekar, "NFET-Based Voltage Regulator of CMOS IC at Near-Threshold-Voltage for Ultra-Low Power-Brief Summary of Technology," Published in engi.philica.com, 2016.

(Continued)

*Primary Examiner* — Jue Zhang
*Assistant Examiner* — Trinh Q Dang
(74) *Attorney, Agent, or Firm* — Thomas Horstemeyer, LLP

(57) ABSTRACT

Disclosed is a voltage regulator for an integrated circuit. The voltage regulator can be configured to regulate a supply voltage provided to the integrated circuit. The integrated circuit can operate a near threshold value irrespective of a magnitude of the supply voltage. The voltage regulator can include a single Field Effect Transistor (FET) based circuit. The single FET based circuit can be configured to regulate the supply voltage.

20 Claims, 12 Drawing Sheets

(51) Int. Cl.
    *G11C 5/14*      (2006.01)
    *H01L 21/66*     (2006.01)

(56) References Cited

U.S. PATENT DOCUMENTS

| | | | | |
|---|---|---|---|---|
| 2012/0293017 A1* | 11/2012 | Lidsky | ................... | H02H 3/087 |
| | | | | 307/126 |
| 2016/0334818 A1* | 11/2016 | Singh | ........................ | G05F 1/56 |
| 2017/0285675 A1* | 10/2017 | Gao | ........................ | G05F 1/575 |
| 2017/0322575 A1* | 11/2017 | Du | ........................... | G05F 1/575 |

OTHER PUBLICATIONS

Binzaid, S., and A. Herlekar, "Near Threshold Voltage (NTV) Regulation for System-on-Chip (SoC)." International Journal of Engineering Research and General Science, vol. 3, Issue 6, Nov.-Dec. 2015.

Binzaid, S., and A. Herlekar, "Ultra-Low Power (μP) VLSI Chip Solution for Battery Operated and Implantable Medical Devices," Life Sciences Leaflets, Published Mar. 1, 2016.

\* cited by examiner

W/L=1, No. of Stages=11.

US 10,475,705 B2

CMOS PROCESS-DEPENDENT NEAR-THRESHOLD VOLTAGE REGULATION

NOTICE OF GOVERNMENT-SPONSORED RESEARCH

This invention was made with Government support under grant contract number 1000000740 awarded by the National Science Foundation. The Government has certain rights in the invention.

BACKGROUND

System-on-chip (SoC) integrated circuits (ICs), which combine multiple very large scale integration (VLSI) designs in a single chip, have become very popular in digital industries, including telecommunications and mechanical controlling. In addition, SoCs have become essential in the healthcare field, especially for life-saving implanted devices, such as pacemakers. In SoCs, a variety of circuits can be incorporated into a single block instead of being built separately on multiple blocks, which reduces production time and cost. Most SoCs are based on complementary metal oxide semiconductor (CMOS) design concepts. CMOS-based circuits offer the advantages of high speed, low power consumption, immunity to harsh environments, and scalability. In addition, CMOS-based circuits provide better signal quality and better frequency response.

There are two types of power consumption in SoCs: static and dynamic power consumption. Due to leakage current, CMOS-based circuits have very low static power consumption. During switching, CMOS transistors operate complementary to each other, in which case dynamic power consumption is at a minimum. Because of the low power consumption of CMOS-based circuits, higher densities of transistors on a chip are possible, which can enable integration of more applications into a single SoC. Because of the reduced power consumption, today's SoCs generate less heat and need little or no cooling.

CMOS-based circuits can be operated in the near-threshold voltage (NTV) region in which power consumption is lowest. Such operation is desirable both in terms of reducing the power that must be supplied to operate a device as well as reducing the amount of heat generated by the device. Research has been performed in the area of NTV using ring oscillators based on an aspect ratio of metal-oxide semiconductor field-effect transistor (MOSFET) devices. This research presented a solution for preventing high power consumption of ICs in which voltage regulators were used to produce a constant output. While such voltage regulators were shown to be effective in terms of controlling voltage output, they also resulted in losses of power. It would be desirable to have a means for regulating voltage supplied to an IC, such as a SoC, that does not suffer from such losses of power.

BRIEF DESCRIPTION OF THE DRAWINGS

The present disclosure may be better understood with reference to the following figures. The components in the drawings are not necessarily to scale, with emphasis instead being placed upon clearly illustrating the principles of the disclosure. Matching reference numerals designate corresponding parts throughout the figures, which are not necessarily drawn to scale.

DETAILED DESCRIPTION

Figure 1:
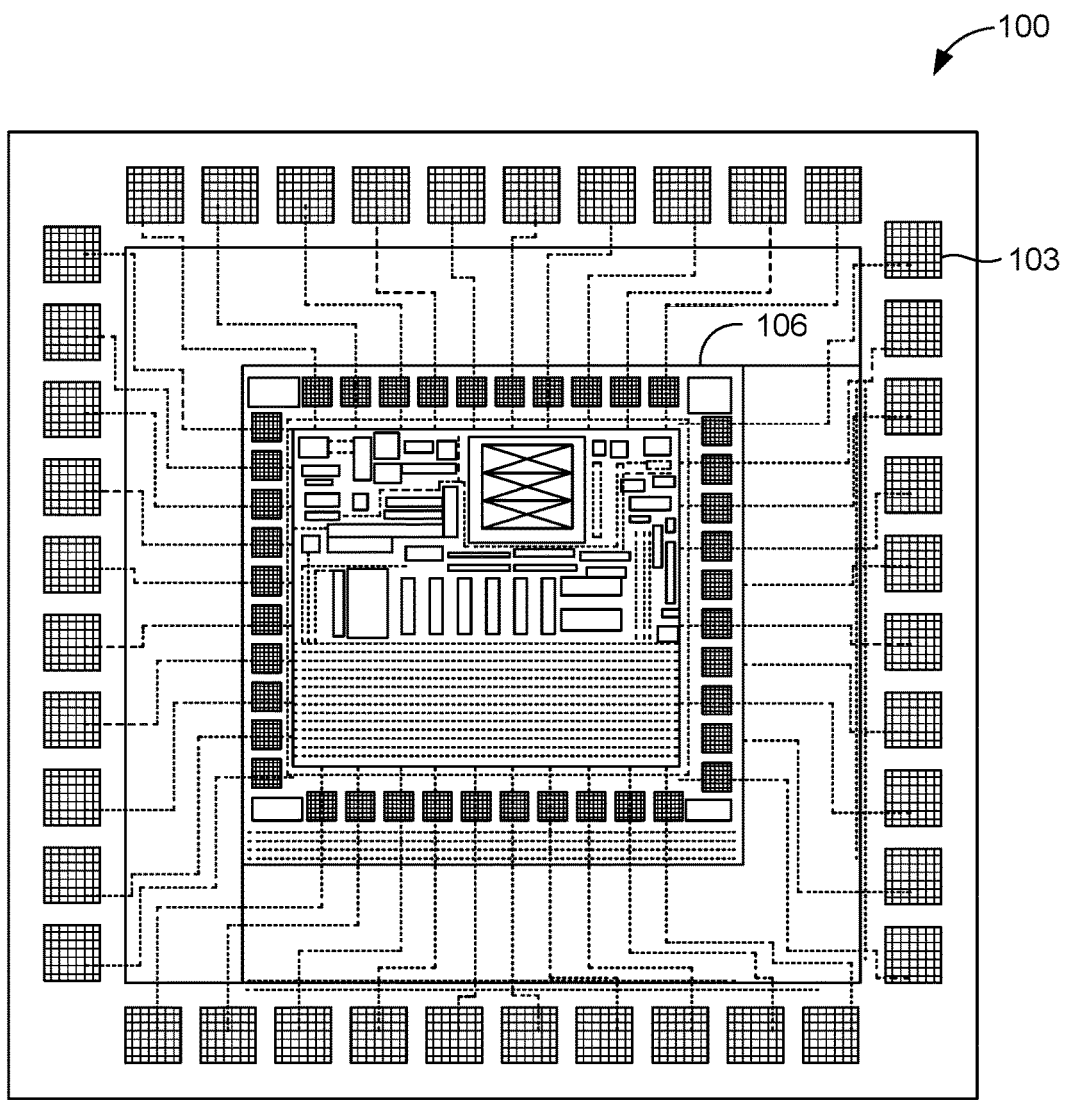
FIG. 1 is a plan view of a layout of a chip that incorporates near-threshold voltage (NTV) voltage regulators according to various embodiments of the present disclosure.

As described above, it would be desirable to operate CMOS-based circuits in the near-threshold voltage (NTV) region to reduce power consumption and heat generation. Disclosed herein are NTV voltage regulators that can be used for this purpose. As described below, the disclosed voltage regulators can provide constant output voltages while minimizing power loss. The voltage regulators can be connected to the input of nearly any circuit to help it run at a minimal voltage and therefore can significantly lower power consumption. In some embodiments, a voltage regulator can be configured as a drop-in module that can be incorporated into a chip that can be interfaced with other modules to provide high power efficiency.

In the following disclosure, various specific embodiments are described. It is to be understood that those embodiments are example implementations of the disclosed inventions and that alternative embodiments are possible. All such embodiments are intended to fall within the scope of this disclosure.

Disclosed herein are novel designs and applications of voltage regulation for providing high power efficiency. The designs were successfully implemented in a chip to provide process-dependent electrical characteristics for automatically controlling voltage regulation. Techniques to reduce power consumption in large CMOS IC's disclosed herein have been proven by running at the NTV at which a circuit is operated just above the threshold voltage ($V_{th}$) where power consumption is at a minimum and the switching of devices is within favorable conditions. The disclosed voltage regulator designs can not only be used in newly designed chips but can also be integrated into existing chips to ensure power efficiency without requiring drastic changes to the chip.

A voltage regulator can be a device that produces a constant output voltage. The voltage regulators of this disclosure provide voltage nearly equal to the NTV value. NTV is approximately 12-20% of the supply voltage, so power consumption is less and the circuits operate favorably. Test circuits were designed to test the designed voltage regulators. These circuits were chosen with different numbers of stages of transistors. The test circuits included not only digital circuits but analog and mixed signal circuits as well. The test circuits include an inverter-based ring oscillator circuit, a voltage control oscillator, and a current mirror circuit. The layouts of these circuits were drawn and incorporated into a test chip.

In the NTV region, CMOS-based circuits can work at very low voltages and therefore provide low power consumption, which results in higher reliability and longer life for the devices that incorporate the circuits. The NTV region is slightly higher than the threshold voltage. When voltage is applied to a CMOS device, a channel depletes the carrier charges and forms a current-carrying path. When the applied voltage is at the threshold level, the channel becomes a complete current-carrying path. When $V_{DD}$ is set slightly higher than the threshold voltage, the circuit switches favorably and power consumption is low.

As described above, a chip was designed to test the disclosed voltage regulators. The circuits were built using Metal 1, Metal 2, and poly for building transistors. Metal contacts, poly contacts, and p-diff and n-diff contacts were used to connect these metals and poly as well. Metal 3 was used to connect all the input outputs to pads. The process technology used for designing the layout was Lambda=0.3. The fabrication process chosen was the AMI C5N process. The chip layout had 40 packaged pins such that there were 40 input/output pads in the pad frame. Each pad had an area of 90 μm×90 μm, and the area of the chip was 2.25 sq. mm. The distance between each pad was 90 μm.

With reference to FIG. 1, shown is a plan view of a layout of a chip that incorporates NTV voltage regulators according to various embodiments of the present disclosure. As shown in this figure, each side of the chip 100 has 10 pins 103. The chip pads have three metals that are connected by Via1 and Via2, which ensures heat tolerance during package processing of the chip 100. The chip 100 can include one or more circuits in a pad frame 106 of the chip 100. Thick metal lines can be used in places where higher density of current may be required in the chip 100. The distance between the pads and the grid lines can be 60 μm. In one embodiment, each power line can be 30 lambda wide. After careful design of the chip layout, the circuits can be strategically added along with one or more of two uniquely designed voltage regulators (see FIGS. 3A and 3B) to test the circuits for operation at NTV. As indicated below, the power efficiency results for each circuit can be calculated and compared.

The following equation can be used to calculate the power:

$$P_{real} = V_{rms} \times I_{rms}$$

where $P_{real}$=Power (μW), $V_{rms}$=Voltage (VDC) and $I_{rms}$=Current (μA)

The power consumed at NTV is smaller than the power consumed at $V_{DD}$. As $V_{DD}$ increases, the power consumption when using $V_{DD}$ increases. Also, the fewer the number of stages of transistors, the less power that is consumed. Likewise, when the aspect ratio is smaller, the power consumed also becomes less. So, power depends on many factors, and is not only dependent on power supply.

To reduce power usage, a chip 100 can be designed with different circuits for reliable operation at NTV. The designed chip should have as low a power consumption as possible. For this, different layouts of the test circuits were designed. These circuits were simulated to find the NTV of each circuit and simulate different voltages starting from $V_{DD}$ down to NTV. The power consumption was determined through simulation and by using the above-mentioned formula for correlation. Graphs were plotted to show the amount of power consumption by each circuit. As an example, for the AMI C5N process technology, the NTV can be set to run circuits at 1 V. In some examples, the VCO and ring oscillator can be used as a clock to any digital circuit. When both circuits are running at the NTV, the power consumption can be minimized. Both the circuits had feedback from the output, which produces delay for monitoring purposes.

Table 1 shows an example of power efficiency at the NTV for different circuits. The circuits were simulated, and the best possible solution to provide internal circuits with constant lower voltages was determined while the supply voltage outside the chip can be at 5V. These circuits were designed to have different numbers of stages of cascaded circuits. Irrespective of the power consumption, the circuits verified substantial power reduction at NTV. The numbers for the example circuits show that for the voltage control oscillator circuit, the power reduction was 284 to 480 times at NTV that of full supply voltage. In the case of the ring oscillator circuit, it was 470 to 480 times. For the current mirror circuit, it was 37 to 38 times.

TABLE 1

| Power reduction of each circuit in chip at NTV | |
|---|---|
| Voltage Control Oscillator | 284X-480X |
| Ring Oscillator | 470X-480X |
| Current Mirror Circuits | 37X-38X |

The above results show that when operating circuits at NTV or at slightly higher than NTV, the switching of the circuits is favorable, and the power that is consumed is much less than at $V_{DD}$. Thus, power consumption in the circuits can be significantly reduced using NTV technology in which switching is favorable to the process technology. To ensure NTV conditions and reduce the dynamic power loss, it is critical to regulate the voltage within the process. It is with this in mind that the voltage regulators discussed herein were designed.

Figure 2:
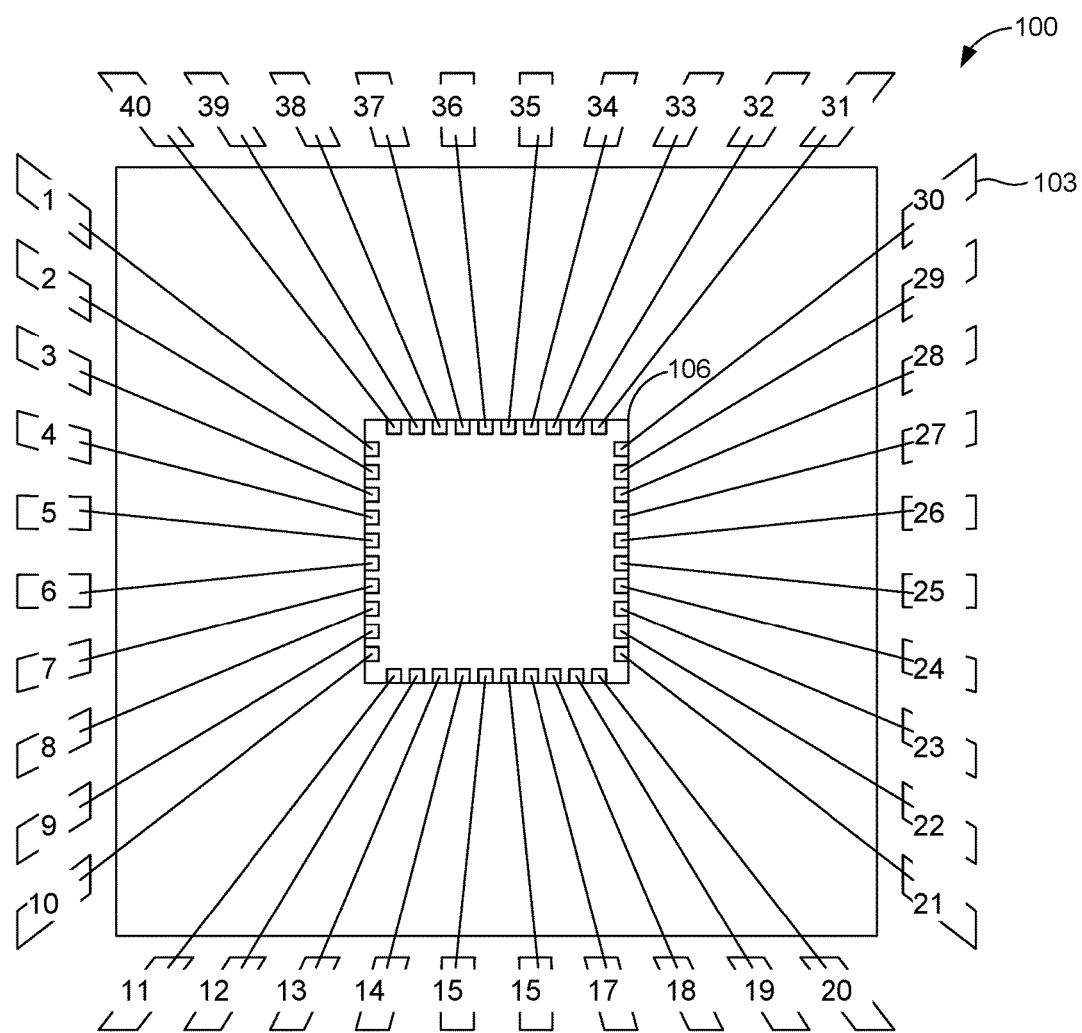
FIG. 2 is a packaging diagram for the chip of FIG. 1 according to various embodiments of the present disclosure.

FIGS. 1 and 2 show the layout of the chip and the chip sitting in a package, respectively according to various embodiments of the present disclosure. Table 2 shows the input-output pin connections of the designed test circuits and the voltage regulator circuit block. In one example embodiment, the chip was designed with the following parameters:

Total area of the chip=2.25 sq. mm
Pad area=90 μm×90 μm
Minimum pad inter-space=30 μm
Scribe line width=60 μm
Package specifications=$O_{cp}$-$Q_{fn}$; 6 mm×6 mm; 40 pins

TABLE 2

| Pin Assignment of NTV SoC | |
|---|---|
| Pin Description | Pin Number |
| VDD1 | 1 |
| VDD2 | 2 |
| Output 1 VCO | 3 |
| Output 2 VCO | 4 |
| Output 3 VCO | 5 |
| Output 4 VCO | 6 |
| Input 1 Diff ampl | 7 |
| Input 2 Diff ampl | 8 |
| Output 1Diff ampl | 9 |
| Input 3 Diff ampl | 10 |
| Output PMOS | 11 |
| Output 2 Diff ampl | 12 |
| Input 2 diff ampl | 13 |

TABLE 2-continued

Pin Assignment of NTV SoC

| Pin Description | Pin Number |
|---|---|
| Input 3 Diff ampl | 14 |
| Output NMOS | 15 |
| 1 Vth | 16 |
| 2 Vth | 17 |
| 3 Vth | 18 |
| Input 1 S PMOS | 19 |
| Input INV | 20 |
| Vdd 3 | 21 |
| GND | 22 |
| Output INV | 23 |
| 2 Vth | 24 |
| Output Curr Mir | 25 |
| Vbias | 26 |
| PMOS2 Vth | 27 |
| Vsensor | 28 |
| Clock Enable | 29 |
| Clock Input | 30 |
| Output NMOS | 31 |
| input Vth | 32 |
| Output Curr Mir | 33 |
| Input 1 Diff ampl | 34 |
| Output NMOS | 35 |
| Output 5 VCO | 36 |
| Output 6 VCO | 37 |
| Output 7 VCO | 38 |
| Output 8VCO | 39 |
| Output 9 VCO | 40 |

To achieve low power consumption in CMOS-based devices, computer-aided drafting (CAD) layouts of different supporting circuits can be created. These circuits can be incorporated into a layout of the chip 100. The MAGIC VLSI tool can be used to complete the chip layout. First, a circuit technology can be chosen, such as, for example, CMOS-based circuits. The circuits can included a voltage control oscillator circuit, an inverter-based ring oscillator, a current mirror circuit, a differential amplifier, and other circuits. A voltage regulator can provide voltage to the circuits.

Figure 3A:
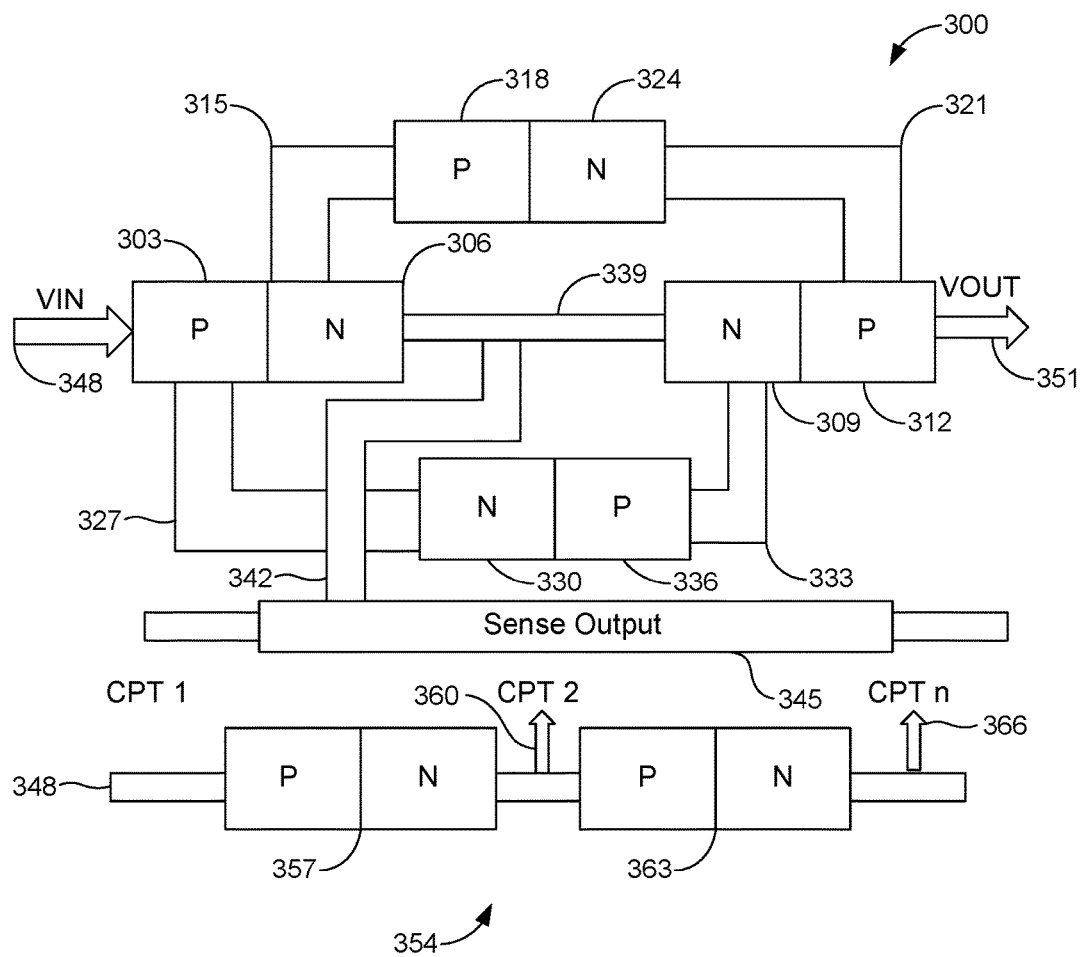
FIGS. 3A and 3B are schematic diagrams of voltage regulator designs using PFET (FIG. 3A) and NFET (FIG. 3B) devices according to various embodiments of the present disclosure.

With reference to FIG. 3A, shown is a schematic diagram of a p-type field effect transistor (PFET) based voltage regulator 300 according to various embodiments of the present disclosure. The voltage regulator 300 includes P-type regions, N-type regions, and one or more metal layers coupling the regions. The voltage regulator 300 can include a transistor formed by the P region 303, the N region 306, the N region 309, and the P region 312. The voltage regulator 300 can include a single FET transistor, as shown in FIG. 3A. A conductor 315 can be coupled between the N region 306 and a P region 318, and a conductor 321 can be coupled between an N region 324 and the P region 312. Similarly, a conductor 327 can be coupled between the P region 303 and an N region 330, and a conductor 333 can be coupled between a P region 336 and the N region 309. The N region 306 and N region 309 are coupled together by a conductor 339, which effectively forms a single N region of a PNP transistor.

The conductor 342 can pass over conductor 327 and electrically couple to the conductor 339 to act as an input to a gate of a transistor. The conductor 342 is coupled to the sense output 345. The sense output 345 can be a metal layer. In some embodiments, the sense output 345 can be made from a polysilicon. The polysilicon can provide a resistance. A voltage source 348 can be coupled to the P region 303 as an input. The voltage source 348 can correspond to a $V_{DD}$ for the circuit 100 (FIG. 1). The output 351 for the voltage regulator 300 can be coupled to a voltage supply of an integrated circuit. The voltage at the output 351 can be regulated based on a voltage level at the sense output 345. The voltage at the sense output 345 can be based on the process threshold voltage. The voltage at the sense output 345 can cause the voltage at the output 351 to be pulled to the NTV region of the integrated circuit. The regulation of voltage by the voltage regulator 300 can be based in part on the layout dimensions of the transistor.

A process parameter circuit 354 can facilitate a voltage output configuring the voltage regulator 300 based on silicon process parameters of the integrated circuit. As an example, the silicon process parameters can include a 500 nm process, a 250 nm process, a 150 nm process, a 90 nm process, or another process. The silicon process parameters can include various dielectric parameters of the silicon. The process parameter circuit 354 can include one or more cascaded P-N junctions. For example, a first P-N junction 357 can have a first output 360, and a second P-N junction 363 can have a second output 366. The voltage source 348 can propagate through the cascaded P-N junctions, such that each sequential output (e.g. output 360 and 363) will have a voltage drop based in part on the manufacturing process used to create the circuit 100, such as, for example, the silicon process parameters of the integrated circuit. The P-N junctions 318 to 324, 336 to 330, 357, and 363 can also be formed using a FET-based diode.

A voltage at the sense output 345 can be based on which of the outputs from the cascaded P-N junctions is connected to the sense output 356. Each of the cascaded P-N junctions can correspond to a diode. As such, the process parameter circuit 354 can include one or more cascaded diodes in series. A voltage loss across each of the cascaded diodes can be based on the silicon process parameters of the integrated circuit. In some embodiments, a number of the cascaded P-N junctions is fixed. The number of cascaded P-N junctions can be based in part on a number of stages of transistors in the integrated circuit.

The voltage regulator 300 can regulate a supply voltage provided to an integrated circuit. The voltage supplied can correspond to an NTV or be near an NTV of the integrated circuit. Accordingly, the voltage regulator 300 can supply the NTV to the integrated circuit. The voltage regulator 300 can receive the supply voltage from the voltage source 348 and generate a voltage near the NTV of the integrated circuit at the output. The voltage at output 351 can be irrespective of the magnitude of the supply voltage at the voltage source 348. The voltage regulator 300 can generate a voltage proximate to the NTV region of the integrated circuit. The voltage regulator 300 can also supply the voltage to the integrated circuit.

The voltage regulator 300 can lower the dynamic power loss for the integrated circuit. In some embodiments, the voltage regulator 300 can reduce the power usage of the integrated circuit by a quadratic ratio. The reduction in power can be based in part on the voltage regulator 300 reducing the supply voltage to the integrated circuit. In some embodiments, the voltage regulator can auto-correct the power requirements of the integrated circuit in the NTV region with an accuracy above 95%.

In some embodiments, the voltage regulator 300 can function as a drop-in module in an integrated circuit. As such, the voltage regulator 300 and the integrated circuit can be on a single chip 100. In other embodiments, the voltage regulator 300 can be a stand-alone circuit that can supply voltage to an external circuit. A power supply of the chip can be connected to an input 348 of the voltage regulator 300. An output 351 of the voltage regulator 300 can be connected to a supply input of the integrated circuit.

The P region 336 and N region 330 can form a diode between the N region 309 and the P region 303. The diode can prevent a reverse bias in the transistor. A reverse bias situation can occur when a current flows backwards based on a feedback from the integrated circuit. The reverse bias can damage a voltage regulator 300 if left alone. The diode formed by the P region 336 and the N region 330 prevent the reverse bias from damaging the circuit. The P region 318 and N region 324 form a same channel path connection. If the transistor is on, the P region 318 and N region 324 has no effect because the current from the voltage source 348 is already flowing through output 351. In some embodiments, the area of the P and N regions can all the same. In some embodiments, aspect ratio of each of the P and N regions can also be the same.

Figure 3B:
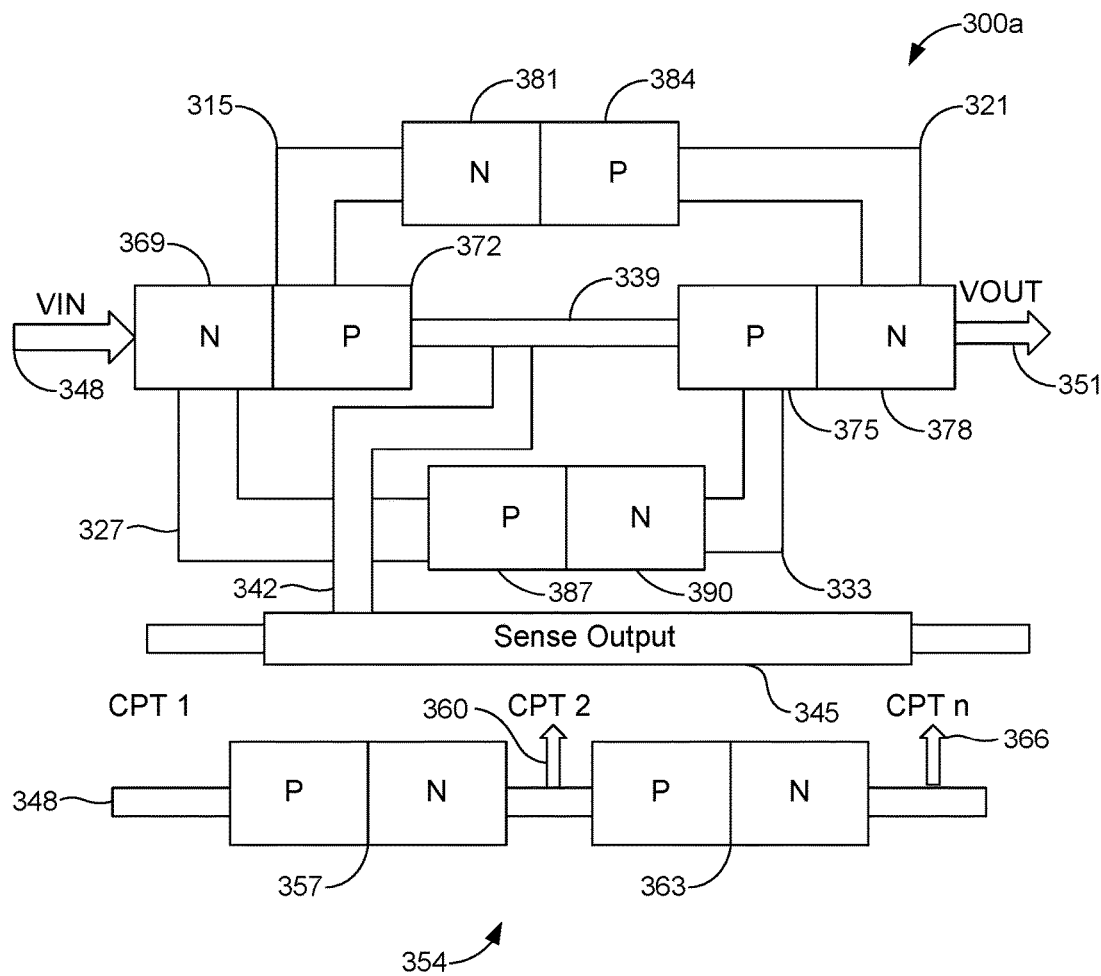

With reference to FIG. 3B, shown is a schematic diagram of an n-type field effect transistor (NFET) based voltage regulator 300a according to various embodiments of the present disclosure. The voltage regulator 300a can function similar to the voltage regulator 300, except that an NFET transistor is used instead of a PFET transistor. As an example, the P regions 303, 312, 324, and 336 are replaced with N regions 369, 378, 381, and 390, and the N regions 306, 309, 324, and 330 are replaced with P regions 372, 375, 384, and 387, respectively. Unless specified otherwise, the voltage regulator 300 and 300a are interchangeable. The P-N junctions 384 to 381, 387 to 390, 357, and 363 can also be formed using a FET-based diode.

The voltage regulator 300 can be one component of a CMOS device and thus can be placed inside the chip's $V_{DD}$ and ground (GND) path without modifying the other NTV components. The design of the voltage regulator 300 can use the process threshold voltage parameters and create a reference voltage to drive the MOS component accurately at very low power demand. Two NFET and PFET based circuits were designed. The voltage regulators have different voltage levels of the process threshold voltage, $V_{th}$. $V_{th}$ is multiplied in numeric formats in the hardware to provide various regulated voltage values and thus goes to the low-voltage level of NTV. The voltage regulators in this system were provided with cascaded $V_{th}$, which can ensure different values of voltages that vary with the process-dependent parameters. Other circuits were designed and verified by simulation for NTV and they were placed in the custom chip.

As a first step in the voltage regulator design process, the NTV of each circuit was determined through simulation. The simulations were performed in PSpice and LTspice software. PSpice is an OrCAD-provided open-source tool. A schematic of a circuit can also be drawn using OrCAD tools. PSpice creates .cir files for the designs, which were further simulated. The student version of PSpice (version 16.6) was used for the simulations. This version has a limitation of simulating only 20 transistor devices. To overcome this limitation, LTspice IV was used for designs with more than 20 transistors. MAGIC VLSI creates a .spice file which can be converted into .dat file in PSpice or LTspice IV. To execute this file, the file needs to be saved in .cir format and then can be executed. Technology files for NMOS and PMOS are used to simulate NMOS and PMOS components.

In one example, MAGIC VLSI has two windows. One is a command window and the other is a layout drawing window. In the command window, different commands can be entered instead of drawing. Before drawing the layout, it can be important to attach a technology file to it. On the right side of the layout drawing window, a tool bar is provided that has different tools such as Poly1, Metal1, Pads, and m1 contact, which are used in drawing the transistor layout. The technology in this example was Lambda=0.3 μm and the process was an AMI C5N process. The N-wells and P-wells need to be set to 0.3 μm to achieve Lambda=0.3 μm. After the design of the layouts have been completed, the file can be extracted by using the command window. The file can then be saved and extracted to the .spice format, which provides detailed information about the circuits. The layouts can be labeled in order to identify inputs, outputs, $V_{DD}$. The layouts designed with the help of Metal 1, Metal 2, Poly, Pads.

In order to ensure low power consumption of the SoC, it is necessary to regulate the voltage to prevent excessive dynamic power loss while running at NTV. The voltage regulator must produce fixed outputs irrespective of changes in the input. FIG. 3 illustrates two designs for voltage regulator circuits that use p-channel and n-channel FET devices (PFET and NFET devices). In the first voltage regulator circuit, the circuit includes an NFET device having a fixed number of cascaded P-N junctions that can provide a different set of output voltages as required by the load to which the circuit is connected. In the second voltage regulator circuit, the circuit comprises a PFET device with another fixed number of cascaded $V_{th}$. The P-N junctions are connected in such a way that different set of values of voltages can be obtained. Both voltage regulator circuits were simulated for both small and large current loads, and the results are described below.

There are many different voltage regulators available on the market, such as the LM 317, 7805, which provides a fixed value of output voltages. These regulators are capable of a minimum voltage of 1.5 V. However, the test chip of this disclosure requires a supply voltage near $V_{th}$. Typically, the AMI C5N process has $V_{th}$ parameters for PMOS and NMOS defined as $V_{tn}$ and $V_{tp}$ for 0.7640855V and −0.9444911V, respectively. The disclosed voltage regulator circuits are capable of producing voltages near these voltages and much lower than 1.5 V. The NFET- and PFET-based circuits can be placed in the chip to drive the circuits of the chip at NTV. In some embodiments, the voltage regulator circuits can be integrated into a drop-in module that can be added to the chip or other SoCs.

The NFET-based voltage regulator uses only one NFET transistor like a pair of P-N junctions and a few additional ultra-low power P-N junctions that create reference threshold voltage states. So, there is no need of NFET transistors, which would only increase power consumption in the test chip. The new design can regulate steady voltage including the NTV of the process that can be selected by the user. The power efficiency of the design is impressive. The voltage reference is produced by ultra-low power junctions by its own silicon process. When this regulator is designed as a drop-in module, it creates a new technology arena in which older, less efficient ICs can be brought back into the market with compatibility, while retaining older process technologies. Working at NTV, these old ICs become like low-power devices found in the newer technologies.

Figure 4A:
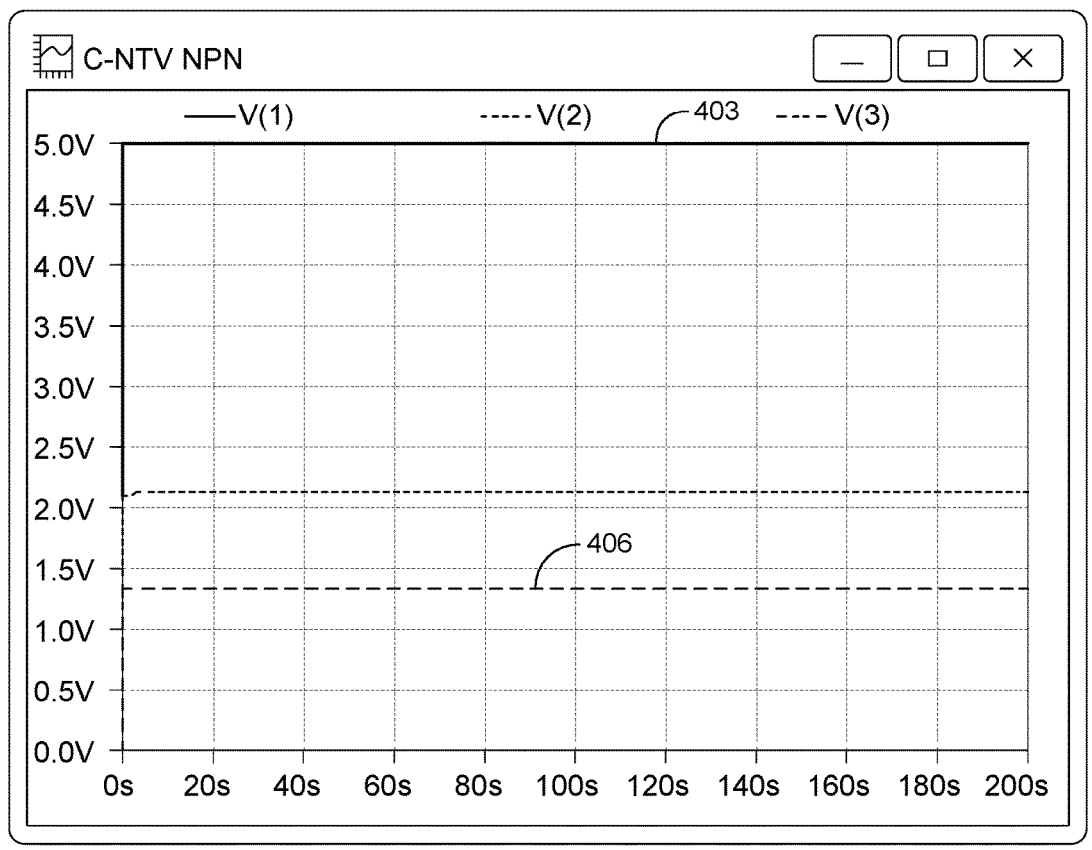
FIGS. 4A and 4B are graphs that show voltage levels for an NFET-based voltage regulator circuit under different loads according to various embodiments of the present disclosure.
Figure 4B:
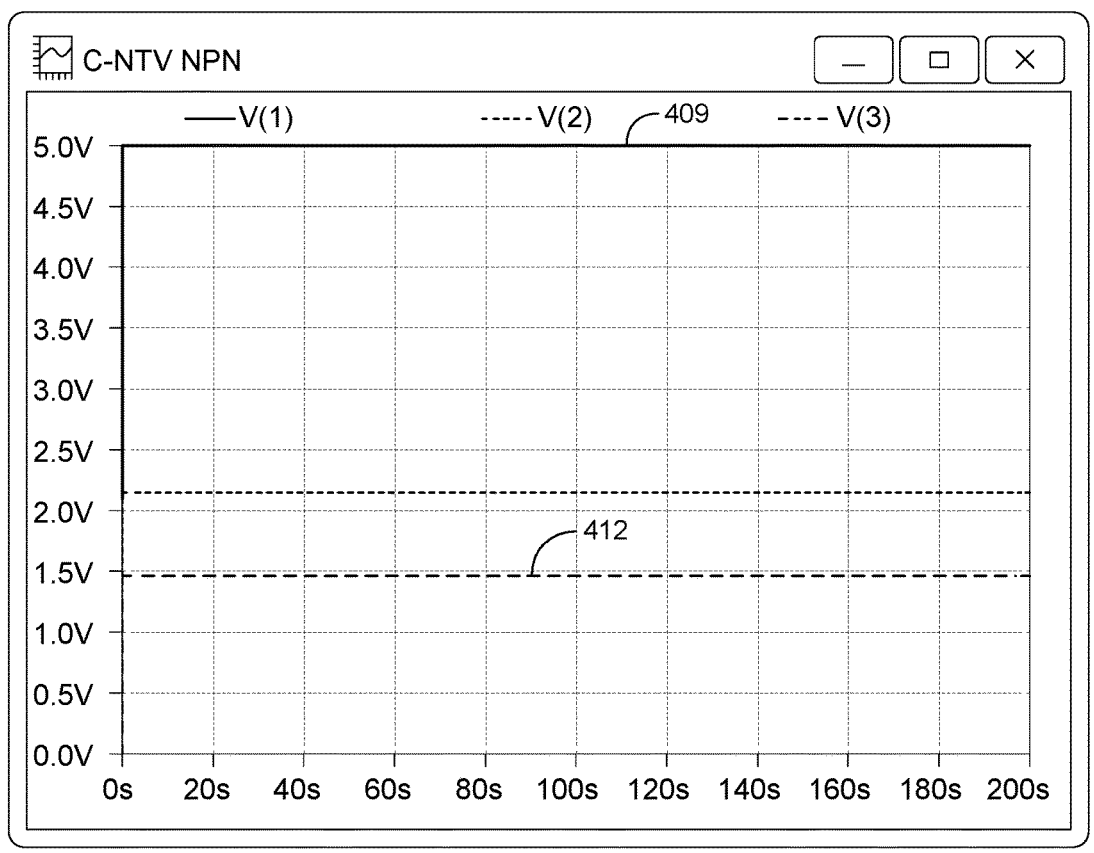

FIGS. 4A and 4B show the results of using the NFET-based voltage regulator 300a (FIG. 3B) according to various embodiments of the present disclosure. $V_{IN}$ (V1) 403 and 409 can be set as 5 V. The load R1 was varied between 1 KOhm and 125 ohms. Therefore, the drawn load current was 40 mA for 125 Ohm. Then, with voltage regulation of NFET cascaded $V_{th}$ and these loads, the output voltage 406 and 412 dropped between 1.35 V to 1.42 V, as shown in FIGS. 4A and 4B, respectively. The load current dropped to about 10.96 mA, therefore ensuring excellent regulation of the technology in C5N process. Because NTV is a process-dependent parameter, the voltage regulator can also provide similar regulation results for any other fabrication processes for its own NTV by this circuit. So, it can be determined that the power ratio=200 mW/15.015 mW=13.32 between 5 V and 1.42 V, thus a reduction of almost 13.32 times. So, the regulation of NTV has the reliability of more than 95%, based on 1.35 V and 1.42 V at regulation.

Figure 5A:
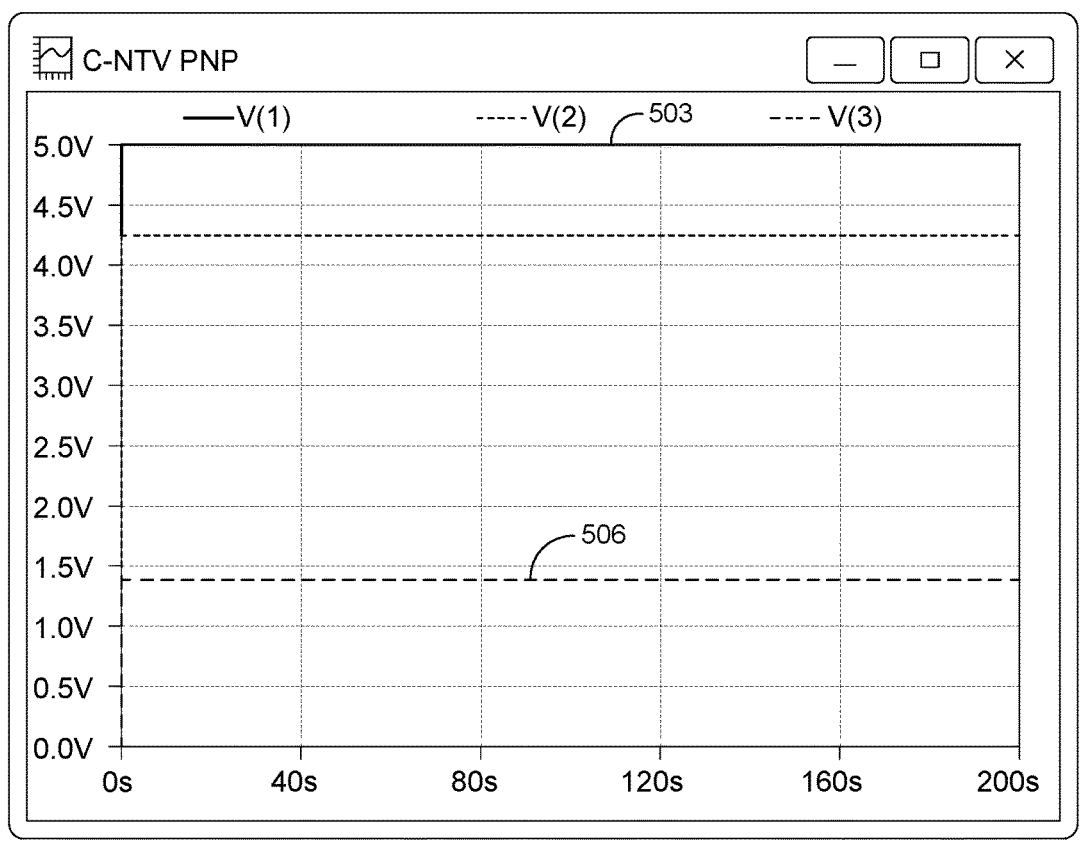
FIGS. 5A and 5B are graphs that show voltage levels for a PFET-based voltage regulator circuit under different loads according to various embodiments of the present disclosure.
Figure 5B:
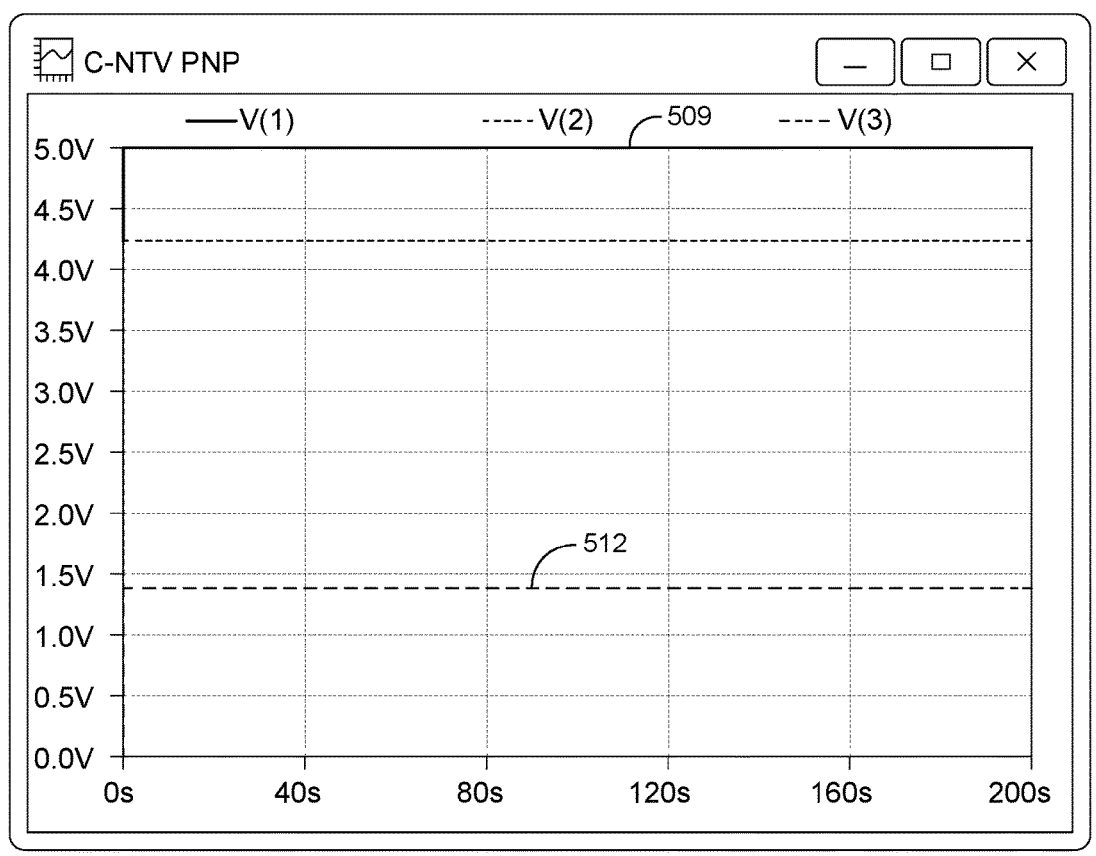
Figure 6A:
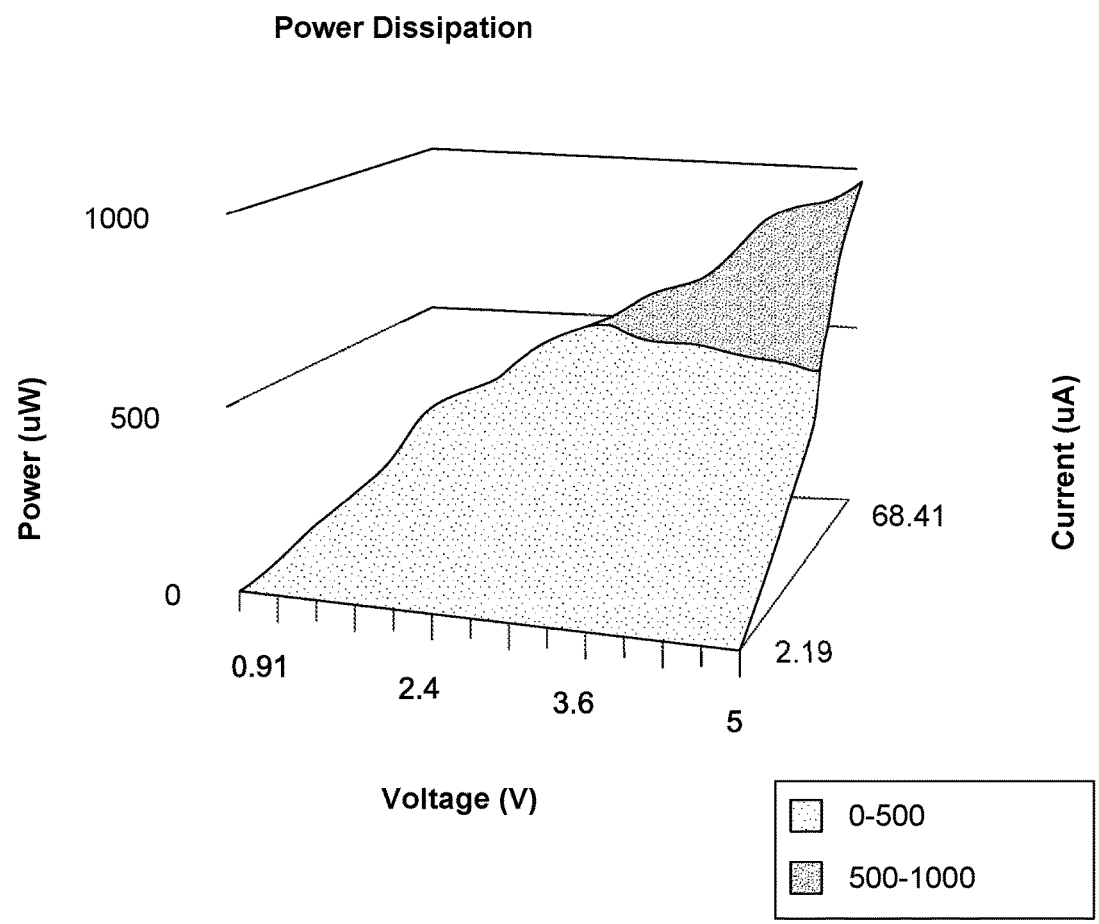
FIGS. 6A-6D are graphs that show power consumption of th voltage regulator circuits under different loads according to various embodiments of the present disclosure.
Figure 6B:
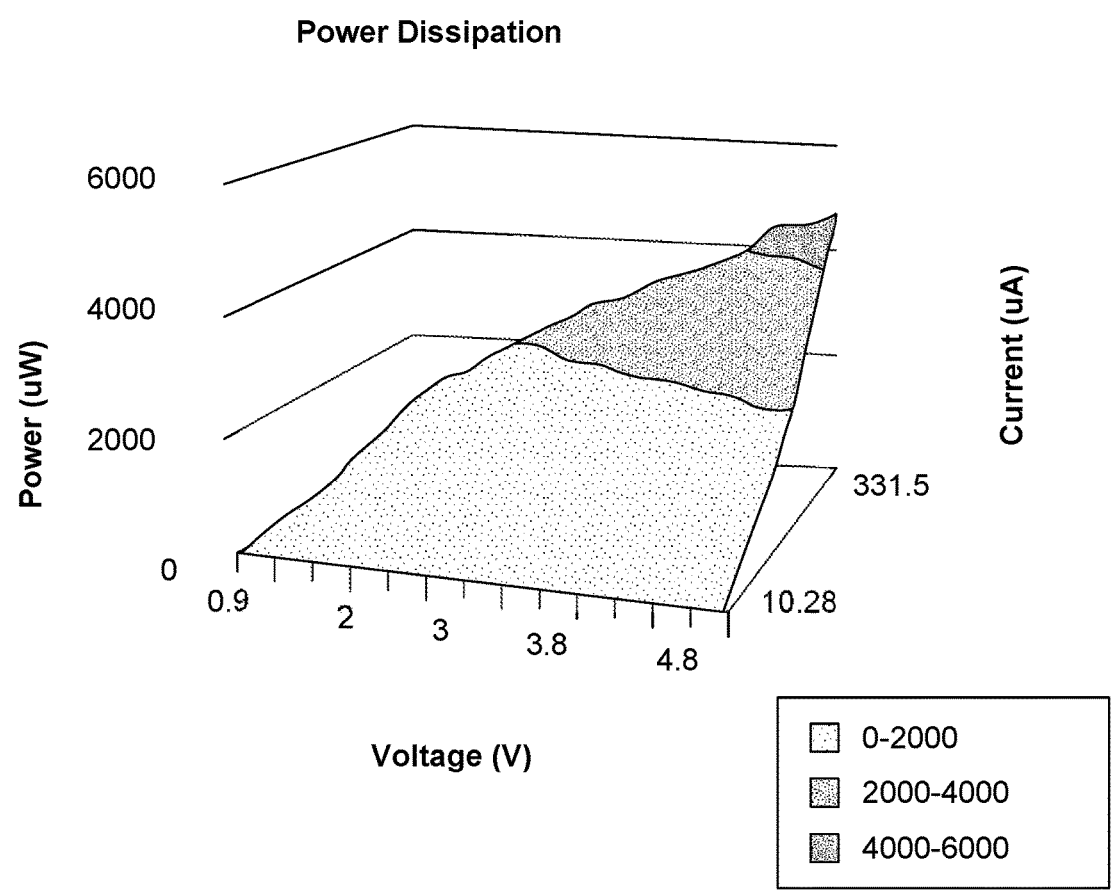
Figure 6C:
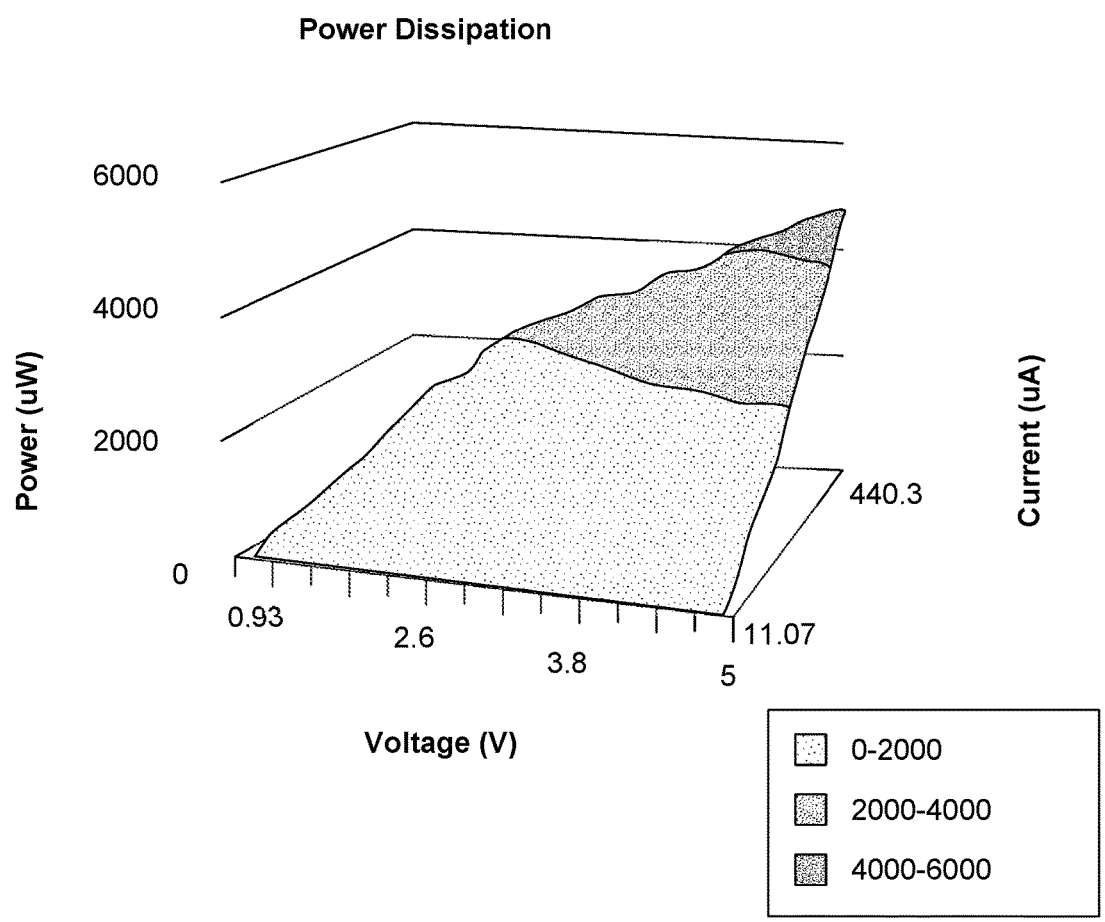
Figure 6D:
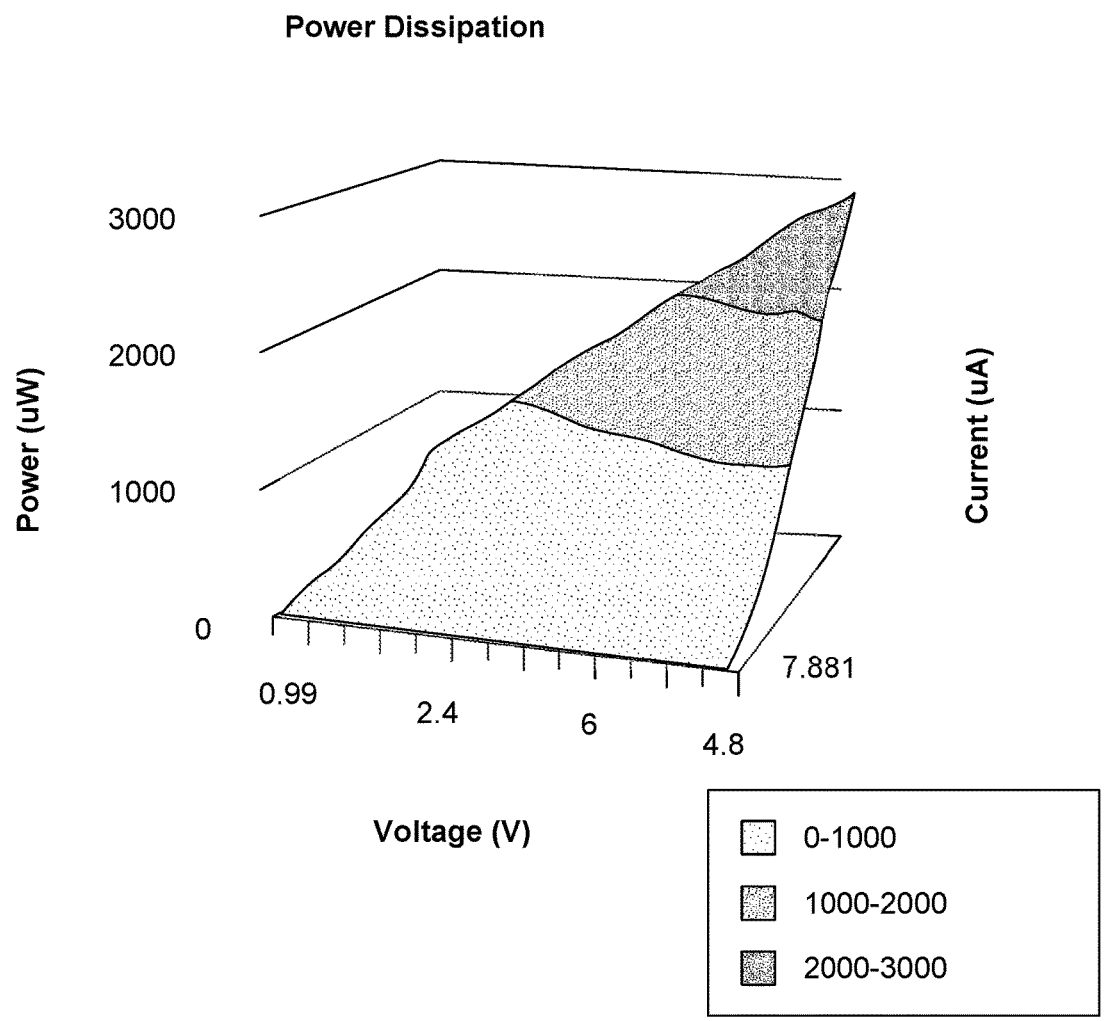

FIGS. 5A and 5B show the results of the PFET-based voltage regulator 300 (FIG. 3A) based on a wide range of loads suitable for running many ICs, regardless of the process technologies, as it self-adjusts to the process. $V_{IN}$ (V1) 503 and 509 can be set as 5 V. Similar simulation techniques were applied to this PFET-based voltage regulator and the power reduction ratio was found to be approximately 11.42. Better regulation responses were achieved on load conditions than the NFET-based voltage regulator for NTV technology. For large current loads at 125 Ohms, the output 506 was also 1.37 V and for small current loads at 10 KOhms the output 512 was also 1.374 V, so the voltage regulation reliability was almost 100%.

After careful review of the designed circuits and verifications, it is concluded that the power consumption is low in the NTV region and, on the other hand, it is much higher at $V_{DD}$=5V. The disclosed voltage regulators exhibit very high power efficiency ranging from 95% to 100%. The higher efficiency reveals that these regulators are highly reliable to run any circuit chip at very low voltage so as to provide low power consumption. Instead of operating circuit at $V_{DD}$, a device can operate in the NTV region. The presented analysis shows that the circuits were simulated for voltages from the NTV to $V_{DD}$ and that energy improvement was up to 480 times at the NTV region.

TABLE 3

Power reduction by voltage regulators at NTV for a large load

| Designed Voltage Regulators | NTV Power Reduced at 125 Ohm Load |
|---|---|
| NFET Based Voltage Regulator | 13.32X |
| PFET Based Voltage Regulator | 11.42X |

The voltage regulation is reliable up to 100%. The voltage regulators provide process-dependent autoregulation that does not require any modification to the existing chip circuits. The internal test circuits can be run on these voltage regulators also. These regulator modules can be used as drop-in modules for any commercially available SoCs to provide low voltage and low current and therefore provide high power efficiency and a low-power SoC solution. The presented analysis and proven power reduction techniques can make a huge impact on digital industries when considering the older, high power consuming chip devices that now can be run at much lower power using these regulator modules.

With reference to FIGS. 6A-6D, shown are graphs of power consumption according to various embodiments of the present disclosure. As the $V_{DD}$ increases, the power usage also increases at a rate of $V_{DD}^2$. The smaller the aspect ratio, the smaller the power consumption becomes. However, as the aspect ratio of width and length of the transistors increases, and as the number of stages in an integrated circuit increases, the power consumption increases. When the voltage regulator 300/300a is used at NTV, the power consumed by the integrated circuit can be very low for any number of stages for any aspect ratio. Although power consumption of the circuit increases in FIGS. 6A-6D when a number of logical stages increases and when the aspect ratio changes, the power consumption at NTV is always low even with those increases.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The invention claimed is:

1. A voltage regulator for an integrated circuit, wherein the voltage regulator is configured to regulate a supply voltage provided to the integrated circuit such that the integrated circuit operates at its near threshold value irrespective of a magnitude of the supply voltage, wherein the supply voltage is regulated via the voltage regulator based at least in part on an input reference, the input reference being based at least in part on a process threshold voltage, wherein a power usage of the integrated circuit is reduced at a quadratic ratio based at least in part on a reduction in the supply voltage.

2. The voltage regulator of claim 1, further comprising a single Field Effect Transistor (FET) based circuit.

3. The voltage regulator of claim 1, wherein the voltage regulator is configured to be added as a drop-in module in the integrated circuit, the voltage regulator being configured to lower a dynamic power loss within the integrated circuit.

4. The voltage regulator of claim 2, wherein the single FET-based circuit is a PFET-based circuit.

5. The voltage regulator of claim 2, wherein the single FET-based circuit is a NFET-based circuit.

6. The voltage regulator of claim 2, further comprising:
a plurality of diodes coupled in series between a power and a ground, each of the plurality of diodes comprising a respective n-region and a respective p-region; and
a sense output coupled to the respective n-region of one of the plurality of diodes.

7. The voltage regulator of claim 2, further comprising a P-N junction configured to prevent a negative bias of the single FET.

8. The voltage regulator of claim 6, wherein the sense output is coupled to a gate of the single FET.

9. A system comprising:
an integrated circuit comprising a near threshold voltage;
a single Field Effect Transistor (FET) based circuit configured to regulate a supply voltage to provide the near threshold voltage to the integrated circuit, wherein the supply voltage is regulated via the single FET based circuit based at least in part on an input reference, the input reference being based at least in part on a process threshold voltage; and
a fixed number of cascaded P-N junctions, wherein a voltage reduction across each of the fixed number of cascaded P-N junctions is based at least in part on a silicon process parameters of the integrated circuit.

10. The system of claim 9, wherein the single FET-based circuit is configured as a drop-in module that can be added to the integrated circuit.

11. The system of claim 9, wherein a single chip comprises the single FET-based circuit and the integrated circuit.

12. The system of claim 9, further comprising coupling a sense output to a gate of the single FET based circuit, the sense output comprising the fixed number of cascaded P-N junctions.

13. The system of claim 9, wherein a power usage of the integrated circuit is reduced at a quadratic ratio based at least in part on a reduction in the supply voltage.

14. A method comprising:
   connecting a power supply of a chip to an input of a voltage regulator;
   connecting an output of the voltage regulator to a voltage supply input of an integrated circuit;
   receiving, via the voltage regulator, a supply voltage, the voltage regulator comprising a single Field Effect Transistor (FET) based circuit;
   generating, via the voltage regulator, a voltage proximate to a near threshold voltage (NTV) region of the integrated circuit;
   supplying, via the voltage regulator, the voltage to the integrated circuit and
   reducing, via the voltage regulator, a power usage of the integrated circuit at a quadratic ratio based at least in part on reducing the supply voltage.

15. The method of claim 14, wherein the voltage is regulated via the voltage regulator based at least in part on an input reference, the input reference being based at least in part on a process threshold voltage.

16. The method of claim 14, further comprising pulling, via a non-FET part of the voltage regulator, the voltage to the NTV region.

17. The method of claim 14, further comprising auto-correcting, via the voltage regulator, power requirements of the integrated circuit in the NTV region with an accuracy above 95%.

18. The method of claim 14, wherein a current driven by the voltage regulator is controlled by a non-FET part of the voltage regulator and a voltage regulation is based at least in part on layout dimensions of a single FET of the voltage regulator.

19. The method of claim 14, wherein the single FET-based circuit is at least one of a PFET-based circuit or an NFET-based circuit.

20. The method of claim 14, further comprising coupling a sense output to a gate of the single FET.

* * * * *